(12) United States Patent
Lin et al.

(10) Patent No.: US 10,205,427 B2
(45) Date of Patent: Feb. 12, 2019

(54) MULTI-WAY POWER AMPLIFIER CIRCUIT

(71) Applicant: National Chi Nan University, Puli, Nantou (TW)

(72) Inventors: Yo-Sheng Lin, Nantou (TW); Jin-You Liao, Nantou (TW)

(73) Assignee: NATIONAL CHI NAN UNIVERSITY, Puli, Nantou (TW)

( * ) Notice: Subject to any disclaimer, the term of this patent is extended or adjusted under 35 U.S.C. 154(b) by 0 days.

(21) Appl. No.: 15/673,476

(22) Filed: Aug. 10, 2017

(65) Prior Publication Data

US 2018/0302050 A1 Oct. 18, 2018

(30) Foreign Application Priority Data

Apr. 17, 2017 (TW) .............................. 106112746 A (51) Int. Cl.
*H03F 3/62* (2006.01)
*H03F 3/21* (2006.01)
*H03F 3/45* (2006.01)
*H03F 3/60* (2006.01)

(52) U.S. Cl.
CPC .............. *H03F 3/62* (2013.01); *H03F 3/211* (2013.01); *H03F 3/45475* (2013.01); *H03F 3/604* (2013.01); *H03F 2200/06* (2013.01); *H03F 2200/09* (2013.01)

(58) Field of Classification Search
CPC ....................................................... H03F 3/62
See application file for complete search history.

(56) References Cited

U.S. PATENT DOCUMENTS

| | | | | |
|---|---|---|---|---|
| 6,265,937 B1 * | 7/2001 | Mohwinkel | ............... | H01P 5/10 330/286 |
| 7,565,116 B2 * | 7/2009 | Okuyama | ............ | H04B 1/0057 330/302 |
| 2001/0001548 A1 * | 5/2001 | Ishida | ....................... | H01P 5/10 330/295 |
| 2009/0258617 A1 * | 10/2009 | Yoshihara | ................. | H01P 5/10 455/127.1 |
| 2013/0099864 A1 * | 4/2013 | Kawai | ....................... | H01P 5/10 330/273 |
| 2016/0126612 A1 * | 5/2016 | Lin | .......................... | H03H 7/42 |
| 2018/0083590 A1 * | 3/2018 | Lin | ......................... | H03F 3/602 |

* cited by examiner

*Primary Examiner* — Patricia T Nguyen
(74) *Attorney, Agent, or Firm* — Merchant & Gould P.C.

(57) ABSTRACT

A multi-way power amplifier circuit includes two baluns and a number (2×N) of differential power amplifiers, where N≥2. Each balun generates a number (N) of corresponding differential intermediate signal pairs based on a respective to-be-amplified signal. Each differential power amplifier generates a respective differential amplified signal pair based on a respective differential intermediate signal pair. One of the baluns includes: a first transmission line and a second transmission line connected to each other; a number (N) of third transmission lines electromagnetically coupled to the first transmission line; and a number (N) of fourth transmission lines electromagnetically coupled to the second transmission line.

8 Claims, 8 Drawing Sheets

MULTI-WAY POWER AMPLIFIER CIRCUIT

CROSS-REFERENCE TO RELATED APPLICATION

This application claims priority of Taiwanese Patent Application No. 106112746, filed on Apr. 17, 2017.

FIELD

The disclosure relates to power amplification, and more particularly to a multi-way power amplifier circuit.

BACKGROUND

A conventional four-way power amplifier circuit includes six Wilkinson power dividers and four differential power amplifiers. The Wilkinson power dividers cooperatively perform power division on a differential to-be-amplified signal pair to generate four differential intermediate signal pairs. Each differential power amplifier performs power amplification on a respective differential intermediate signal pair to generate a respective differential amplified signal pair. Due to the inclusion of the six Wilkinson power dividers, the conventional four-way power amplifier circuit occupies a relatively large area and consumes relatively high power.

SUMMARY

Therefore, an object of the disclosure is to provide a multi-way power amplifier circuit that can alleviate the drawbacks of the prior art.

According to an aspect of the disclosure, the multi-way power amplifier circuit includes a first balun, a second balun and a number (2×N) of differential power amplifiers, where N≥2. Each of the first and second baluns is used to receive a respective one of a first to-be-amplified signal and a second to-be-amplified signal that cooperatively constitute a differential to-be-amplified signal pair, and performs unbalance to balance conversion and power division on the respective one of the first and second to-be-amplified signals to generate a number (N) of corresponding differential intermediate signal pairs. The first balun includes an input terminal, a number (N) of output terminal pairs, an internal node, a first transmission line, a second transmission line, a number (N) of third transmission lines and a number (N) of fourth transmission lines. The input terminal is used to receive the first to-be-amplified signal. Each of the output terminal pairs includes a first output terminal and a second output terminal, and outputs a respective one of the differential intermediate signal pairs that are generated by the first balun. The first transmission line is connected between the input terminal and the internal node. The second transmission line is connected to the internal node. Each of the third transmission lines is disposed adjacent to and spaced apart from the first transmission line so as to establish electromagnetic coupling therebetween, and is connected between the first output terminal of a respective one of the output terminal pairs and ground. Each of the fourth transmission lines is disposed adjacent to and spaced apart from the second transmission line so as to establish electromagnetic coupling therebetween, and is connected between the second output terminal of a respective one of the output terminal pairs and ground. Each of a number (N) of the differential power amplifiers is connected to a respective one of the output terminal pairs of the first balun for receiving a respective one of the differential intermediate signal pairs that are generated by the first balun, and performs power amplification on the received differential intermediate signal pair to generate a respective differential amplified signal pair. Each of remaining ones of the differential power amplifiers is connected to the second balun for receiving a respective one of the differential intermediate signal pairs that are generated thereby, and performs power amplification on the received differential intermediate signal pair to generate a respective differential amplified signal pair.

According to another aspect of the disclosure, the multi-way power amplifier circuit includes a balun and a number (N) of differential power amplifiers, where N≥2. The balun is used to receive a to-be-amplified signal, and performs unbalance to balance conversion and power division on the to-be-amplified signal to generate a number (N) of differential intermediate signal pairs. The balun includes an input terminal, a number (N) of output terminal pairs, an internal node, a first transmission line, a second transmission line, a number (N) of third transmission lines and a number (N) of fourth transmission lines. The input terminal is used to receive the to-be-amplified signal. Each of the output terminal pairs includes a first output terminal and a second output terminal, and outputs a respective one of the differential intermediate signal pairs. The first transmission line is connected between the input terminal and the internal node. The second transmission line is connected to the internal node. Each of the third transmission lines is disposed adjacent to and spaced apart from the first transmission line so as to establish electromagnetic coupling therebetween, and is connected between the first output terminal of a respective one of the output terminal pairs and ground. Each of the fourth transmission lines is disposed adjacent to and spaced apart from the second transmission line so as to establish electromagnetic coupling therebetween, and is connected between the second output terminal of a respective one of the output terminal pairs and ground. Each of the differential power amplifiers is connected to a respective one of the output terminal pairs of the balun for receiving a respective one of the differential intermediate signal pairs therefrom, and performs power amplification on the received differential intermediate signal pair to generate a respective differential amplified signal pair.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1:
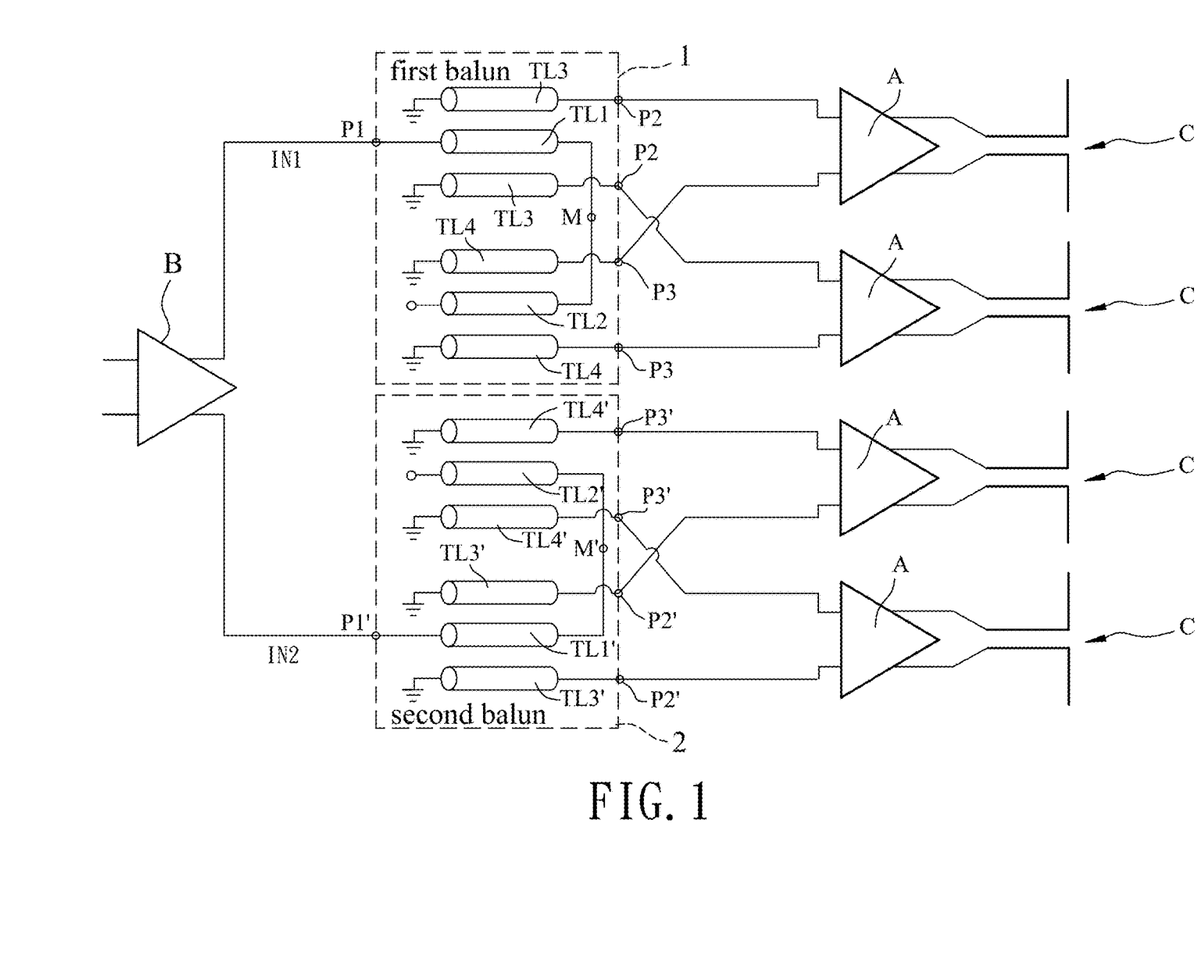
FIG. 1 is a circuit diagram illustrating a first embodiment of a multi-way power amplifier circuit according to the disclosure.

Referring to FIG. 1, a first embodiment of a multi-way power amplifier circuit according to the disclosure includes a first balun 1, a second balun 2 and a number (2×N) of differential power amplifiers (A), where N≥2. In this embodiment, N=2, and the multi-way power amplifier circuit is a four-way power amplifier circuit.

The first and second baluns 1, 2 are used to respectively receive a first to-be-amplified signal (IN1) and a second to-be-amplified signal (IN2). The first and second to-be-amplified signals (IN1, IN2) are from, for example, a differential power amplifier (B), and cooperatively constitute a differential to-be-amplified signal pair. Each of the first and second baluns 1, 2 performs unbalance to balance conversion and power division on a respective one of the first and second to-be-amplified signals (IN1, IN2) to generate a number (N) (i.e., two in this embodiment) of corresponding differential intermediate signal pairs.

In this embodiment, each of the first and second baluns 1, 2 includes an input terminal (P1, P1'), a number (N) (i.e., two in this embodiment) of output terminal pairs ((P2, P3), (P2', P3')), an internal node (M, M'), a first transmission line (TL1, TL1'), a second transmission line (TL2, TL2'), a number (N) (i.e., two in this embodiment) of third transmission lines (TL3, TL3') and a number (N) (i.e., two in this embodiment) of fourth transmission lines (TL4, TL4'). For the first balun 1, the input terminal (P1) is used to receive the first to-be-amplified signal (IN1); and each output terminal pair (P2, P3) includes a first output terminal (P2) and a second output terminal (P3), and outputs a respective one of the differential intermediate signal pairs that are generated by the first balun 1. For the second balun 2, the input terminal (P1') is used to receive the second to-be-amplified signal (IN2); and each output terminal pair (P2', P3') includes a first output terminal (P2') and a second output terminal (P3'), and outputs a respective one of the differential intermediate signal pairs that are generated by the second balun 2. For each of the first and second baluns 1, 2, the first transmission line (TL1, TL1') is connected between the input terminal (P1, P1') and the internal node (M, M'); the second transmission line (TL2, TL2') has a first terminal that is connected to the internal node (M, M'), and a second terminal that is open circuited; each third transmission line (TL3, TL3') is disposed adjacent to and spaced apart from the first transmission line (TL1, TL1') so as to establish electromagnetic coupling therebetween, and is connected between the first output terminal (P2, P2') of a respective output terminal pair ((P2, P3), (P2', P3')) and ground; each fourth transmission line (TL4, TL4') is disposed adjacent to and spaced apart from the second transmission line (TL2, TL2') so as to establish electromagnetic coupling therebetween, and is connected between the second output terminal (P3, P3') of a respective output terminal pair ((P2, P3), (P2', P3')) and ground; and each of the first to fourth transmission lines (TL1-TL4, TL1'-TL4') has a length that substantially equals a quarter of a wavelength of the differential to-be-amplified signal pair (IN1, IN2).

Each of a number (N) (i.e., two in this embodiment) of the differential power amplifiers (A) is connected to a respective output terminal pair (P2, P3) of the first balun 1 for receiving a respective one of the differential intermediate signal pairs that are generated by the first balun 1, and performs power amplification on the received differential intermediate signal pair to generate a respective differential amplified signal pair. Each of remaining ones of the differential power amplifiers (A) is connected to a respective output terminal pair (P2', P3') of the second balun 2 for receiving a respective one of the differential intermediate signal pairs that are generated by the second balun 2, and performs power amplification on the received differential intermediate signal pair to generate a respective differential amplified signal pair. Each differential amplified signal pair is transmitted via, for example, a respective antenna (C).

Figure 2:
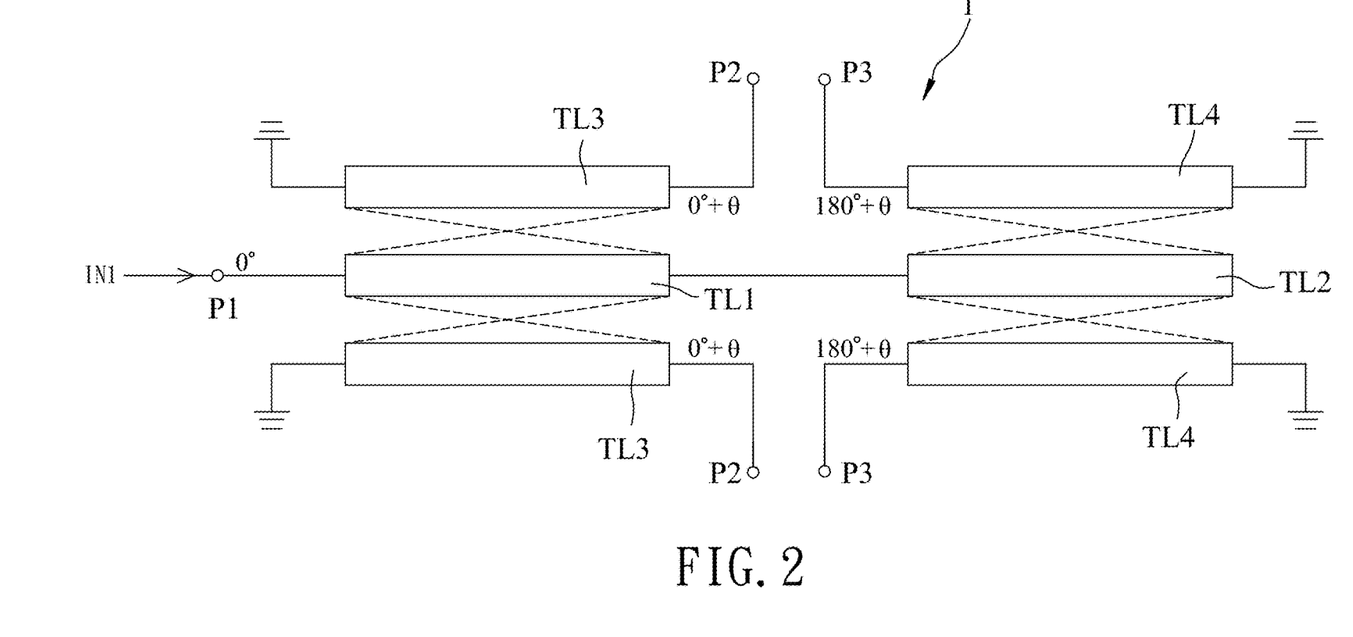
FIGS. 2 and 3 are schematic diagrams illustrating phase relationships among a first to-be-amplified signal, a second to-be-amplifed signal, a plurality of differential intermediate signal pairs (which are generated based on the first to-be-amplified signal) and a plurality of other differential intermediate signal pairs (which are generated based on the second to-be-amplified signal) of the first embodiment.
Figure 3:
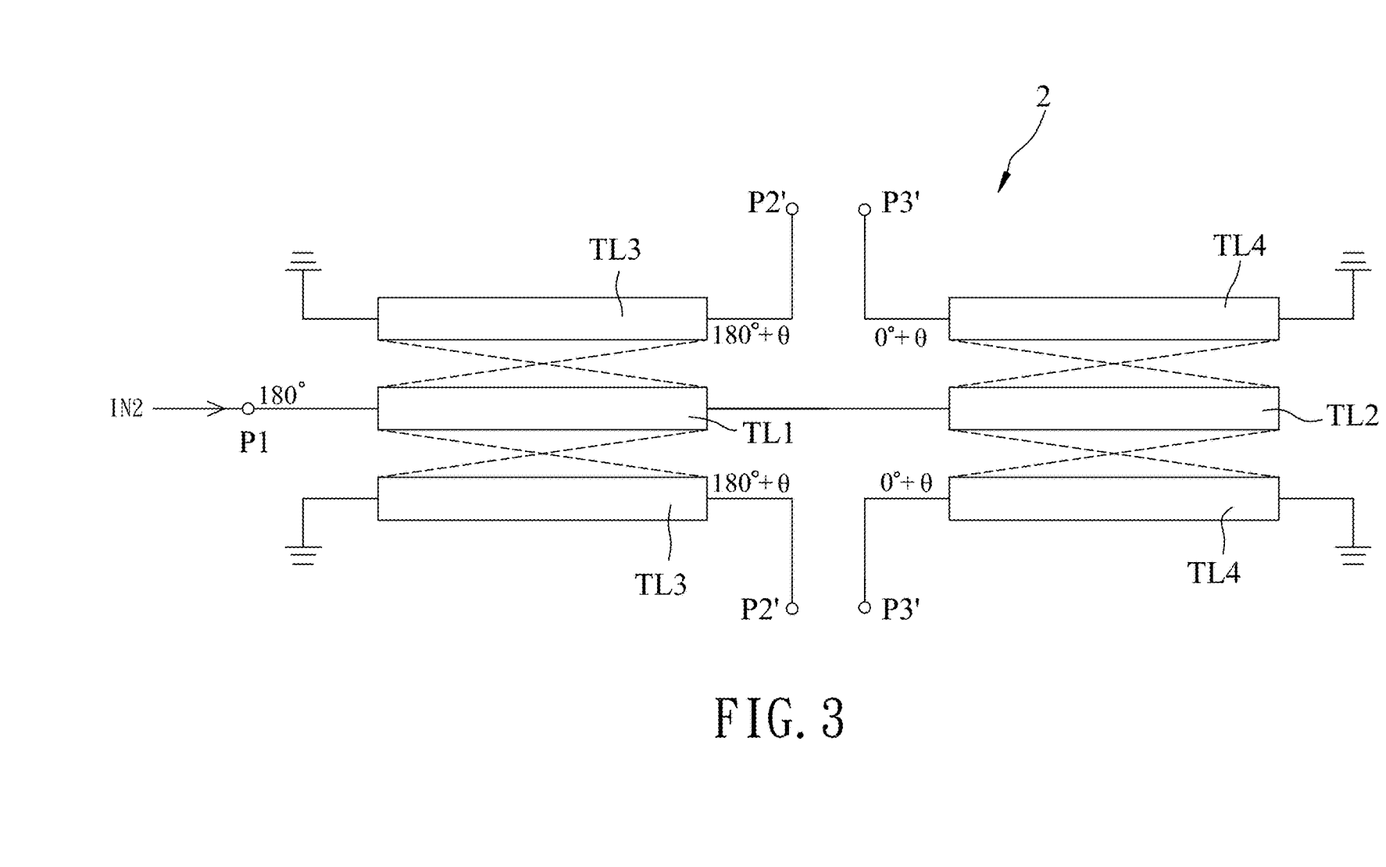

Referring to FIGS. 2 and 3, assuming that the first to-be-amplified signal (IN1) has a phase of 0°, and that the second to-be-amplified signal (IN2) has a phase of 180°, signals respectively provided at the first output terminals (P2) of the first balun 1 and signals respectively provided at the second output terminals (P3') of the second balun 2 have substantially the same phase of (0°+θ), and signals respectively provided at the second output terminals (P3) of the first balun 1 and signals respectively provided at the first output terminals (P2') of the second balun 2 have substantially the same phase of (180°+θ), where θ is theoretically 90°.

It should be noted that, in this embodiment, the first and second baluns 1, 2 have the same layout, and therefore only the first balun 1 is exemplarily described hereinafter for the sake of brevity.

Figure 4:
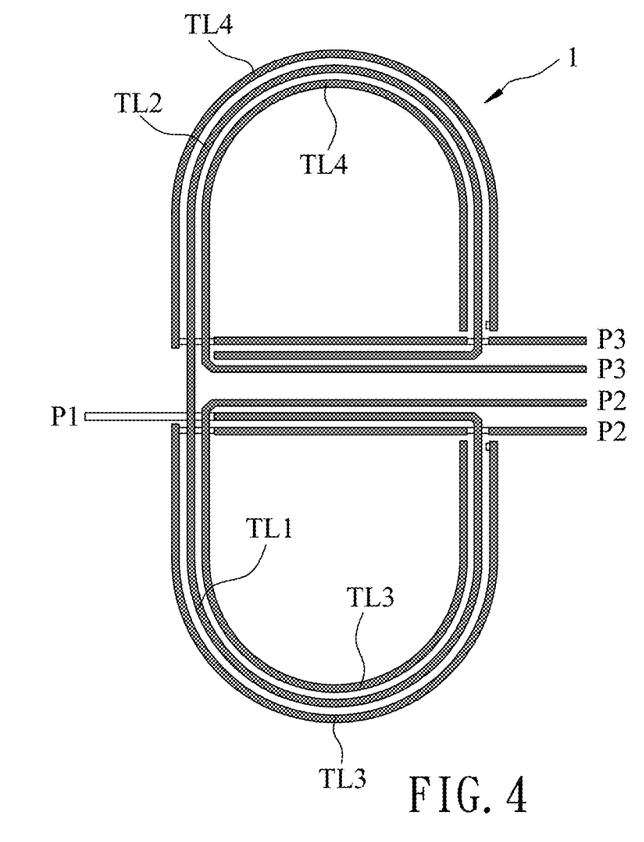
FIG. 4 is a layout diagram illustrating a first balun of the first embodiment.

Referring to FIG. 4, in this embodiment, the first to fourth transmission lines (TL1-TL4) are formed mainly in a predetermined metal layer of a semiconductor process, and have the same width. For example, the first transmission line (TL1), the second transmission line (TL2), a first one of the third transmission lines (TL3) and a first one of the fourth transmission lines (TL4) are wholly formed in the predetermined metal layer of the semiconductor process, and a second one of the third transmission lines (TL3) and a second one of the fourth transmission lines (TL4) are partially formed outside of the predetermined metal layer of the semiconductor process. The first and third transmission lines (TL1, TL3) are configured as interwound spirals. The first transmission line (TL1) is disposed between and equidistant from the third transmission lines (TL3). The second and fourth transmission lines (TL2, TL4) are configured as interwound spirals. The second transmission line (TL2) is disposed between and equidistant from the fourth transmission lines (TL4). A distance between the first transmission line (TL1) and each third transmission line (TL3) equals a distance between the second transmission line (TL2) and each fourth transmission line (TL4). Therefore, power of the first to-be-amplified signal (IN1) (see FIG. 1) is substantially equally divided between the third and fourth transmission lines (TL3, TL4). It should be noted that each spiral may be a semi-circular spiral as shown in FIG. 4 rather than a rectangular spiral, so that the first balun 1 results in lower insertion loss, lower amplitude imbalances and better phase differences, and so that the multi-way power amplifier circuit of this embodiment can have better performances.

Figure 5:
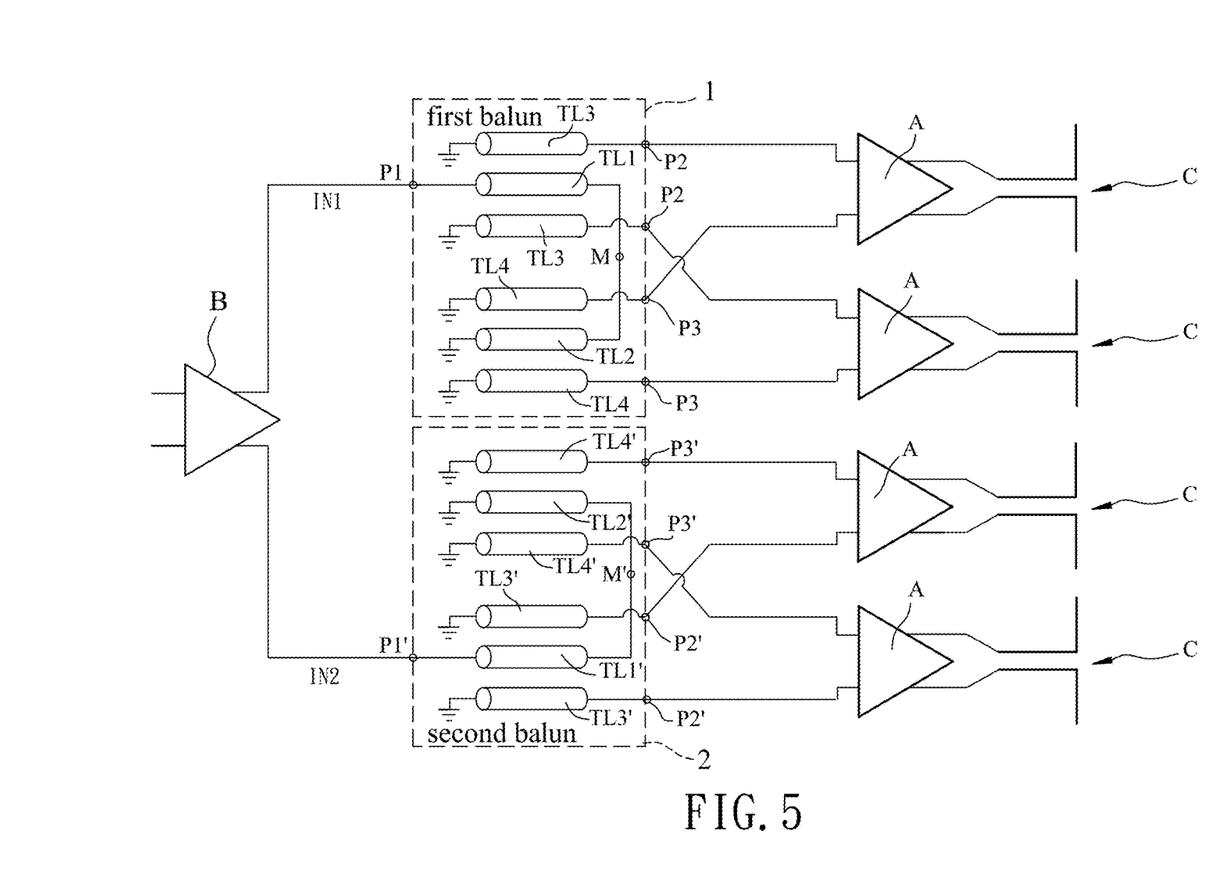
FIG. 5 is a circuit diagram illustrating a second embodiment of the multi-way power amplifier circuit according to the disclosure.

Referring to FIG. 5, a second embodiment of the multi-way power amplifier circuit according to the disclosure is a modification of the first embodiment, and differs from the first embodiment in that: (a) the second terminal of the second transmission line (TL2, TL2') of each of the first and second baluns 1, 2 is grounded, instead of being open circuited; and (b) the length of each of the first to fourth transmission lines (TL1-TL4, TL1'-TL4') of the first and second baluns 1, 2 substantially equals one-twelfth, instead of a quarter, of the wavelength of the differential to-be-amplified signal pair (IN1, IN2). Therefore, each of the first and second baluns 1, 2 of the second embodiment can occupy less area and can consume less power as compared to that of the first embodiment.

Figure 6:
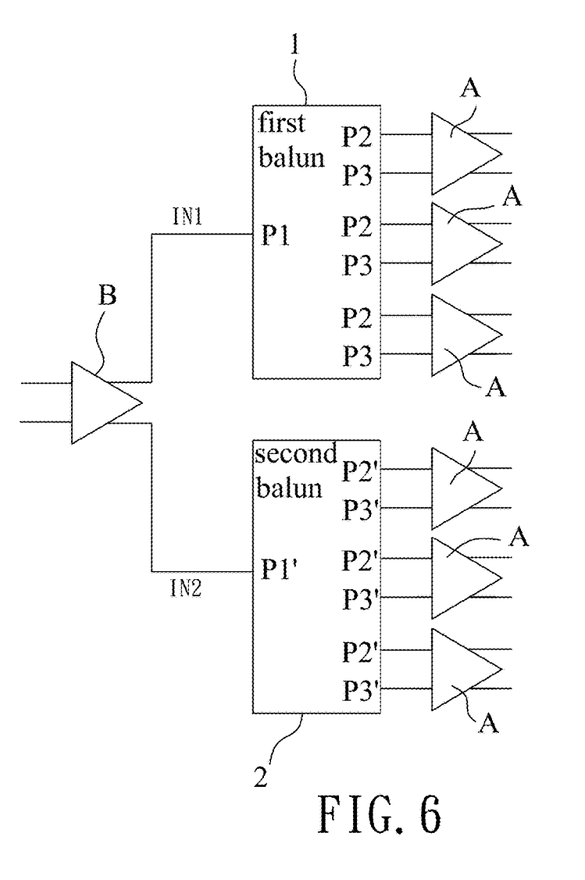
FIG. 6 is a circuit block diagram illustrating a third embodiment of the multi-way power amplifier circuit according to the disclosure.
Figure 7:
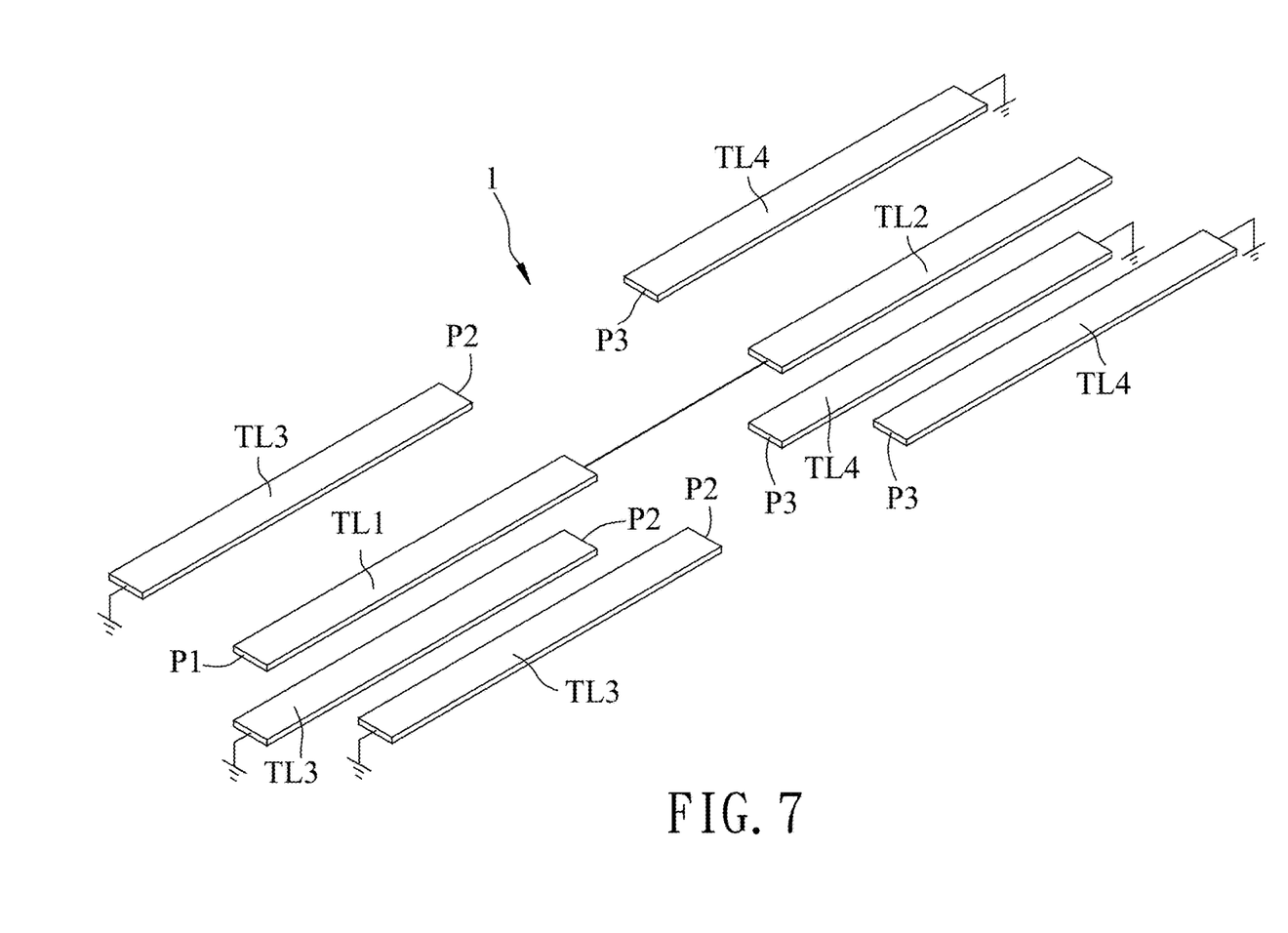
FIG. 7 is a schematic diagram illustrating a first balun of the third embodiment.
Figure 8:
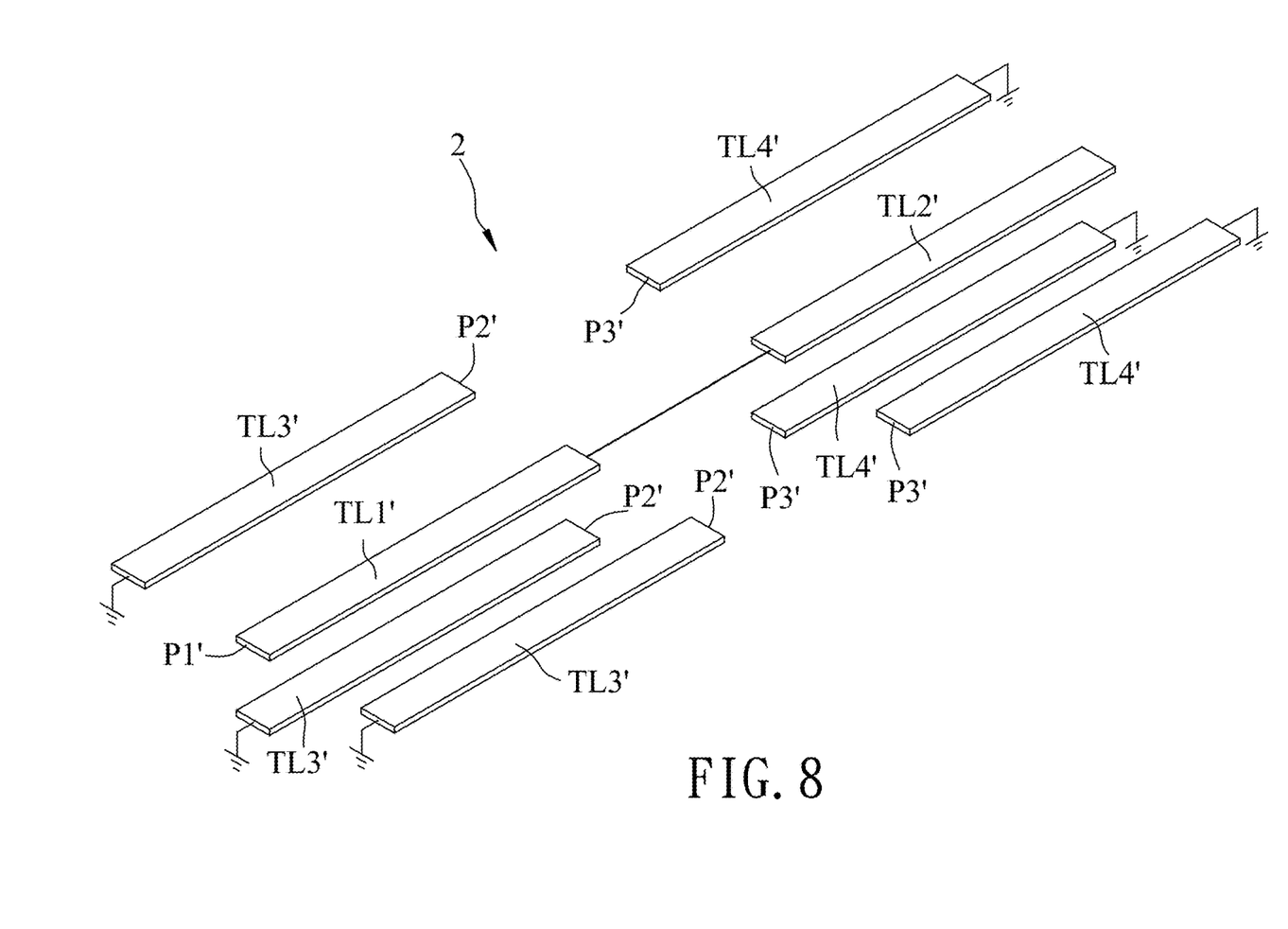
FIG. 8 is a schematic diagram illustrating a second balun of the third embodiment.

Referring to FIGS. 6, 7 and 8, a third embodiment of the multi-way power amplifier circuit according to the disclosure is a modification of the first embodiment, and differs from the first embodiment in that: (a) N=3; (b) the multi-way power amplifier circuit is a six-way power amplifier circuit; and (c) for each of the first and second baluns 1, 2, a third one of the third transmission lines (TL3, TL3') and a third one of the fourth transmission lines (TL4, TL4') are formed in another metal layer of the semiconductor process that is either under the predetermined metal layer as shown in FIGS. 7 and 8, or above the predetermined metal layer.

In the third embodiment, for each of the first and second baluns 1, 2, the third one of the third transmission lines (TL3, TL3') is aligned with an imaginary longitudinal central line of the first transmission line (TL1, TL1'), and the third one of the fourth transmission lines (TL4, TL4') is aligned with an imaginary longitudinal central line of the second transmission line (TL2, TL2').

Moreover, for each of the first and second baluns 1, 2, a distance between the first transmission line (TL1, TL1') and each third transmission line (TL3, TL3') and a distance between the second transmission line (TL2, TL2') and each fourth transmission line (TL4, TL4') are designed such that the power of the respective one of the first and second to-be-amplified signals (IN1, IN2) is substantially equally divided among the third and fourth transmission lines (TL3, TL3', TL4, TL4').

Referring to FIGS. 1 and 5 to 8, in view of the above, two baluns 1, 2 (each including a number (2×N+2) of transmission lines (TL1-TL4, TL1'-TL4') are required in the multi-way power amplifier circuit of each embodiment to divide a differential to-be-amplified signal pair (IN1, IN2) into a number (2×N) of differential intermediate signal pairs. In addition, for the multi-way power amplifier circuit of each of the first and third embodiments, each of the first and second baluns 1, 2 can be designed such that an area occupied thereby substantially equals that occupied by a Wilkinson power divider, and such that power consumption thereof substantially equals that of the Wilkinson power divider. Therefore, the four-way power amplifier circuit of the first embodiment can occupied less area and can consume less power as compared to the conventional four-way power amplifier circuit that requires six Wilkinson power dividers.

Moreover, since the occupied area and the power consumption of each of the first and second baluns 1, 2 of the second embodiment can be less as respectively compared to those of the first embodiment, the four-way power amplifier circuit of the second embodiment can occupied less area and can consume less power as compared to that of the first embodiment.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what are considered the exemplary embodiments, it is understood that the disclosure is not limited to the disclosed embodiments but is intended to cover various arrangements included within the spirit and scope of the broadest interpretation so as to encompass all such modifications and equivalent arrangements.

What is claimed is:

1. A multi-way power amplifier circuit comprising:
    a first balun and a second balun, each used to receive a respective one of a first to-be-amplified signal and a second to-be-amplified signal that cooperatively constitute a differential to-be-amplified signal pair, and each performing unbalance to balance conversion and power division on the respective one of the first and second to-be-amplified signals to generate a number (N) of corresponding differential intermediate signal pairs, where N≥2;
    said first balun including
    an input terminal used to receive the first to-be-amplified signal,
    a number (N) of output terminal pairs, each including a first output terminal and a second output terminal, and each outputting a respective one of the differential intermediate signal pairs that are generated by said first balun,
    an internal node,
    a first transmission line connected between said input terminal and said internal node,
    a second transmission line connected to said internal node,
    a number (N) of third transmission lines, each disposed adjacent to and spaced apart from said first transmission line so as to establish electromagnetic coupling therebetween, and each connected between said first output terminal of a respective one of said output terminal pairs and ground, and
    a number (N) of fourth transmission lines, each disposed adjacent to and spaced apart from said second transmission line so as to establish electromagnetic coupling therebetween, and each connected between said second output terminal of a respective one of said output terminal pairs and ground; and
    a number (2×N) of differential power amplifiers, each of a number (N) of said differential power amplifiers being connected to a respective one of said output terminal pairs of said first balun for receiving a respective one of the differential intermediate signal pairs that are generated by said first balun, and performing power amplification on the received differential intermediate signal pair to generate a respective differential amplified signal pair, each of remaining ones of said differential power amplifiers being connected to said second balun for receiving a respective one of the differential intermediate signal pairs that are generated thereby, and performing power amplification on the received differential intermediate signal pair to generate a respective differential amplified signal pair.

2. The multi-way power amplifier circuit of claim 1, wherein said second balun includes:
an input terminal used to receive the second to-be-amplified signal;
a number (N) of output terminal pairs, each including a first output terminal and a second output terminal, each connected to a respective one of said remaining ones of said differential power amplifiers, and each outputting a respective one of the differential intermediate signal pairs that are generated by said second balun;
an internal node;
a first transmission line connected between said input terminal of said second balun and said internal node of said second balun;
a second transmission line connected to said internal node of said second balun;
a number (N) of third transmission lines, each disposed adjacent to and spaced apart from said first transmission line of said second balun so as to establish electromagnetic coupling therebetween, and each connected between said first output terminal of a respective one of said output terminal pairs of said second balun and ground, and
a number (N) of fourth transmission lines, each disposed adjacent to and spaced apart from said second transmission line of said second balun so as to establish electromagnetic coupling therebetween, and each connected between said second output terminal of a respective one of said output terminal pairs of said second balun and ground.

3. The multi-way power amplifier circuit of claim 1, wherein said second transmission line has a first terminal that is connected to said internal node, and a second terminal that is open circuited.

4. The multi-way power amplifier circuit of claim 3, wherein each of said first to fourth transmission lines has a length that substantially equals a quarter of a wavelength of the differential to-be-amplified signal pair.

5. The multi-way power amplifier circuit of claim 1, wherein said second transmission line has a first terminal that is connected to said internal node, and a second terminal that is grounded.

6. The multi-way power amplifier circuit of claim 5, wherein each of said first to fourth transmission lines has a length that substantially equals one-twelfth of a wavelength of the differential to-be-amplified signal pair.

7. The multi-way power amplifier circuit of claim 1, wherein said first to fourth transmission lines have the same width.

8. A multi-way power amplifier circuit comprising:
a balun used to receive a to-be-amplified signal, and performing unbalance to balance conversion and power division on the to-be-amplified signal to generate a number (N) of differential intermediate signal pairs, where $N \geq 2$;
said balun including
an input terminal used to receive the to-be-amplified signal,
a number (N) of output terminal pairs, each including a first output terminal and a second output terminal, and each outputting a respective one of the differential intermediate signal pairs,
an internal node,
a first transmission line connected between said input terminal and said internal node,
a second transmission line connected to said internal node,
a number (N) of third transmission lines, each disposed adjacent to and spaced apart from said first transmission line so as to establish electromagnetic coupling therebetween, and each connected between said first output terminal of a respective one of said output terminal pairs and ground, and
a number (N) of fourth transmission lines, each disposed adjacent to and spaced apart from said second transmission line so as to establish electromagnetic coupling therebetween, and each connected between said second output terminal of a respective one of said output terminal pairs and ground; and
a number (N) of differential power amplifiers, each connected to a respective one of said output terminal pairs of said balun for receiving a respective one of the differential intermediate signal pairs therefrom, and each performing power amplification on the received differential intermediate signal pair to generate a respective differential amplified signal pair.

* * * * *